United States Patent
Itani

(10) Patent No.: US 7,643,736 B2
(45) Date of Patent: Jan. 5, 2010

(54) APPARATUS AND METHOD FOR MANUFACTURING SEMICONDUCTOR DEVICES

(75) Inventor: Takaharu Itani, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 11/727,519

(22) Filed: Mar. 27, 2007

(65) Prior Publication Data
US 2007/0232083 A1    Oct. 4, 2007

(30) Foreign Application Priority Data
Mar. 29, 2006   (JP)  .......................... P2006-091812

(51) Int. Cl.
*F26B 19/00*    (2006.01)
*F27B 5/14*    (2006.01)

(52) U.S. Cl. .................. 392/416; 219/390; 219/405; 219/411; 392/418; 118/724; 118/725; 118/50.1

(58) Field of Classification Search ............... 219/390, 219/405, 411; 392/416, 418; 118/724–5, 118/50.1
See application file for complete search history.

(56) References Cited

U.S. PATENT DOCUMENTS

| 6,885,815 B2 * | 4/2005 | Kusuda et al. | ............... 392/416 |
| 6,905,983 B2 | 6/2005 | Itani | |
| 6,951,996 B2 * | 10/2005 | Timans et al. | ............... 219/390 |

FOREIGN PATENT DOCUMENTS

| JP | 6-318558 | 11/1994 |
| JP | 2003-77852 | 3/2003 |
| JP | 2004-127978 | 4/2004 |

* cited by examiner

*Primary Examiner*—Shawntina Fuqua
(74) *Attorney, Agent, or Firm*—Finnegan, Henderson, Farabow, Garrett & Dunner, L.L.P.

(57) ABSTRACT

An apparatus for manufacturing a semiconductor device includes a treatment chamber in which a working substrate is disposed; a plurality of lamps provided above the treatment chamber; and a reflector provided behind the lamps relative to a direction towards the working substrate, spatially controlling an in-plane distribution of reflection rate of light beams from the lamps, and irradiating the working substrate with light from the lamps.

16 Claims, 17 Drawing Sheets

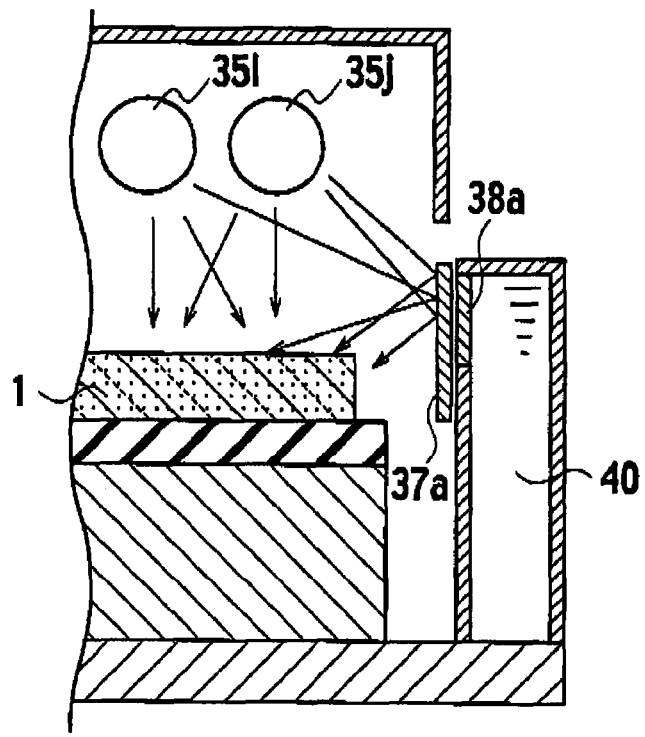
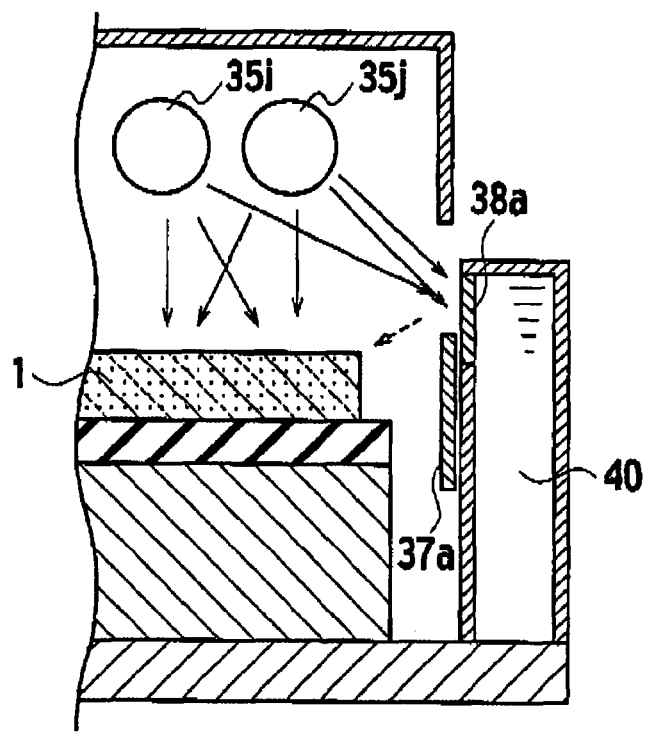

APPARATUS AND METHOD FOR MANUFACTURING SEMICONDUCTOR DEVICES

CROSS REFERENCE TO RELATED APPLICATIONS AND INCORPORATION BY REFERENCE

This application is based upon and claims the benefit of priority from the prior Japanese Patent Application No. P2006-091812, filed on Mar. 29, 2006; the entire contents of which are incorporated herein by reference.

BACKGROUND OF THE INVENTION

1. Field of the Invention

The present invention relates to an apparatus and a method for manufacturing semiconductor devices 2. Description of the Related Art As performance of large scale integrated circuits (LSI) improves, a density of component integration or a finer design of components included in LSI has been increased. In order to realize finer components, it is necessary not only to reduce an area of an impurity diffusion region in a plane pattern but also to reduce a depth of the impurity diffusion region. Therefore, it has been increasingly important to optimize ion implantation and following thermal treatment (annealing) when creating an impurity diffusion region such as a source/drain region and a functional region such as a channel region that is immediately below a gate insulator.

Annealing has been conducted under conditions of, for example, 1000 degrees centigrade for 30 minutes. However, annealing in such high-temperature and long-period conditions causes both activation and diffusion of an impurity at the same time. Hence, a rapid thermal annealing (RTA) method using a tungsten (W) halogen lamp or the like under conditions of 1000 degrees centigrade for about 10 seconds has been introduced as a treatment method in a minimum duration to achieve activation of an impurity while minimizing impurity diffusion. However, even with RTA, impurity diffusion still happens after annealing, and therefore it is difficult to obtain a desired impurity profile.

Laser annealing has been considered as a method for instantaneously supplying energy which is necessary for activation. However, since laser is highly directive light, a multi-photon process or interference occurs. Moreover, an energy density of a laser beam per unit time and unit area becomes too high. As a result, a surface of a semiconductor substrate (wafer) melts, and a situation which is almost like evaporation or laser ablation is induced, thus deteriorating surface morphology of a semiconductor substrate after activation.

Apart from RTA and laser annealing, flash lamp annealing (FLA) in which the lamp is filled with gas such as xenon is attracting a great deal of attention as means for improving an activation ratio in an extremely short period. For example, conditions for flash lamp annealing are, an annealing time of 10 milliseconds or smaller, and radiant energy density of 100 J/cm$^2$ or smaller. With FLA, diffusion of an impurity is suppressed, and at the same time, an impurity is activated. Moreover, there are no secondary deterioration effects which occur during laser annealing. Therefore, FLA has been attracting attention as a new annealing technique which forms an extremely shallow junction.

However, in a full-field exposure type annealing, typified by FLA, performed by millisecond, it is difficult to anneal the entire surface of a wafer with even temperature. For example, for FLA, one or more stick-shaped lamps are arranged to face a substrate. Light beams emitted from each lamp reach the substrate directly or indirectly via a reflection plate, and are absorbed. Light beams from the lamps radiate in every direction about the lamps. Therefore, in order to obtain an uniform light intensity over a substrate surface, it is necessary to optimize a distance between lamps and a substrate, a reflection power of a reflection plate provided on the opposite side of a substrate relative to the lamps, a distance between lamps and the reflection plate, and the like, and then arrange the lamps, substrate, and reflection plate accordingly.

However, since lamps have unavoidable variation in quality due to manufacturing processes thereof, they also vary in the conversion efficiency, in which electric power is converted into light power. Hence, even if arrangement of lamps and a substrate is designed in an ideal manner, in reality, uniformity of light intensities on a substrate is deteriorated, or, when a lamp is replaced as it reaches the end of its life, lamps lose uniformity. Pre-heating a substrate to some hundreds degrees centigrade before being exposed to light by placing the substrate on a hot plate or the like is one of effective methods for improving stability during a super-short optical thermal treatment process. However, if the hot plate fails to have high uniformity of temperature, temperature that the substrate reaches as a result of light irradiation loses uniformity. In a manufacturing process for a fine semiconductor device, if temperature of thermal treatment for forming a source/drain diffusion layer is not uniform, resultant properties of manufactured transistors do not become uniform. In a semiconductor device manufacturing process where productivity is guaranteed by mass-manufacturing of a large number of chips out of a single wafer, variation in properties on the same substrate means the number of non-defective products gained from a single wafer is reduced, and as a result, this will be a factor of an increase in manufacturing costs for semiconductor devices.

In optical thermal treatment equipment which takes a few seconds or more for thermal treatment, in order to compensate variation in intensity of light from lamps, a wafer, or a substrate may be rotated while being heated. Even if there is two-dimensional irregularity of light intensity in a direction of rotating a substrate (wafer), the irregularity can be applied to each section of the semiconductor evenly by rotating the substrate. Therefore, deterioration of uniformity can be suppressed in the rotation direction of the substrate (wafer). Also employed is means for monitoring a plurality of points of a substrate and, from the monitored temperature of each point, controlling light intensities of corresponding lamps using closed-loop feedback.

However, in a case of FLA where light is emitted at millisecond, it is in fact difficult to rotate a substrate once within an extremely short period like a millisecond, and this method of substrate rotation cannot be used. Moreover, since duration of light emission is extremely short, irradiation time is not sufficient for feedback control of lamp intensity even if temperature is monitored. Therefore, it is impossible to monitor temperature with high accuracy. Moreover, even if rotation or feedback control is feasible, variation in temperature of a hot plate cannot be cancelled.

SUMMARY OF THE INVENTION

An aspect of the present invention inheres in an apparatus for manufacturing a semiconductor device encompassing a treatment chamber in which a working substrate is disposed; a plurality of lamps provided above the treatment chamber; and a reflector provided behind the lamps relative to a direction towards the working substrate, spatially controlling an in-plane distribution of reflection rate of light beams from the lamps, and irradiating the working substrate with light from the lamps.

Another aspect of the present invention inheres in an apparatus for manufacturing a semiconductor device encompassing a treatment chamber in which a working substrate is disposed; a plurality of lamps provided above the treatment chamber; and a reflector provided in the treatment chamber, spatially controlling an in-plane distribution of reflection rate of light beams from the lamps, and irradiating the working substrate with light from the lamps. Still another aspect of the present invention inheres in a method for manufacturing a semiconductor device encompassing implanting impurity ions into a first semiconductor substrate and a second semiconductor substrate, respectively, to prepare a first working substrate and a second working substrate; carrying the first working substrate into a treatment chamber to irradiate the first working substrate with light from a plurality of lamps so as to activate the implanted ions in the first working substrate and to form a first impurity diffusion layer in the first working substrate in a condition where a plurality of opening portions of a reflection plate provided above or on an inner surface of the treatment chamber are covered with a plurality of light shielding plates; carrying the first working substrate out of the treatment chamber; measuring an electric characteristic of the first impurity diffusion layer; adjusting an opening rate of the opening portions by moving the light shielding plates depending on a measurement result of the electric characteristic; and carrying the second working substrate into the treatment chamber to irradiate the second working substrate with light from the lamps so as to activate the implanted ions in the second working substrate and to form a second impurity diffusion layer in the second working substrate.

BRIEF DESCRIPTION OF DRAWINGS

FIG. 24 is a perspective view illustrating an apparatus for manufacturing semiconductor devices according to a modification of the embodiment;

FIG. 25 is a schematic diagram illustrating a ray of light emitted from lamps according to the apparatus for manufacturing semiconductor devices according to the modification of the embodiment;

DETAILED DESCRIPTION OF THE INVENTION

Figure 1:
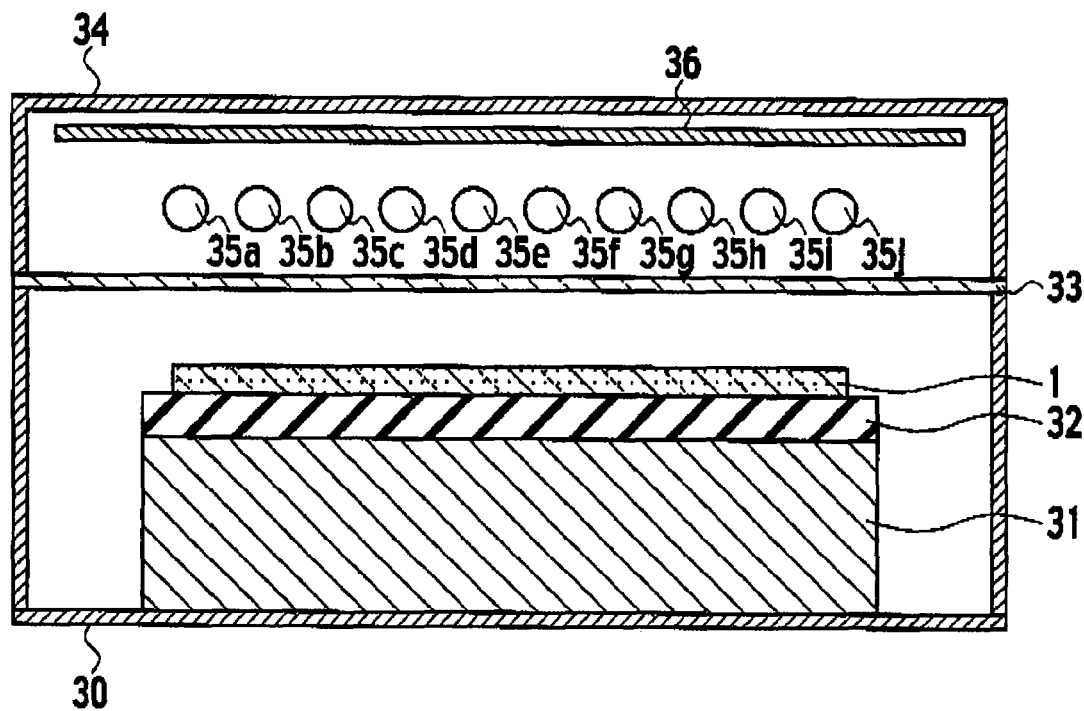
FIG. 1 is a cross-sectional view illustrating an apparatus for manufacturing semiconductor devices according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous details are set forth such as specific signal values, etc. to provide a thorough understanding of the present invention. However, it will be obvious to those skilled in the art that the present invention may be practiced without such specific details.

—Apparatus for Manufacturing Semiconductor Devices—

As shown in FIG. 1, an apparatus for manufacturing a semiconductor device according to an embodiment of the present invention is provided with a treatment chamber 30 in which a working substrate 1 is placed, a plurality of lamps 35a, 35b, 35c, 35d, 35e, 35f, 35g, 35h, 35i, and 35j provided above the treatment chamber 30, and a reflection plate 36 which is placed behind the plurality of lamps 35a to 35j relative to the direction towards the working substrate 1, spatially control an in-plane distribution of reflection rate of light beams from the plurality of lamps 35a to 35j, and irradiate the working substrate with light from the plurality of lamps 35a to 35j.

Figure 2:
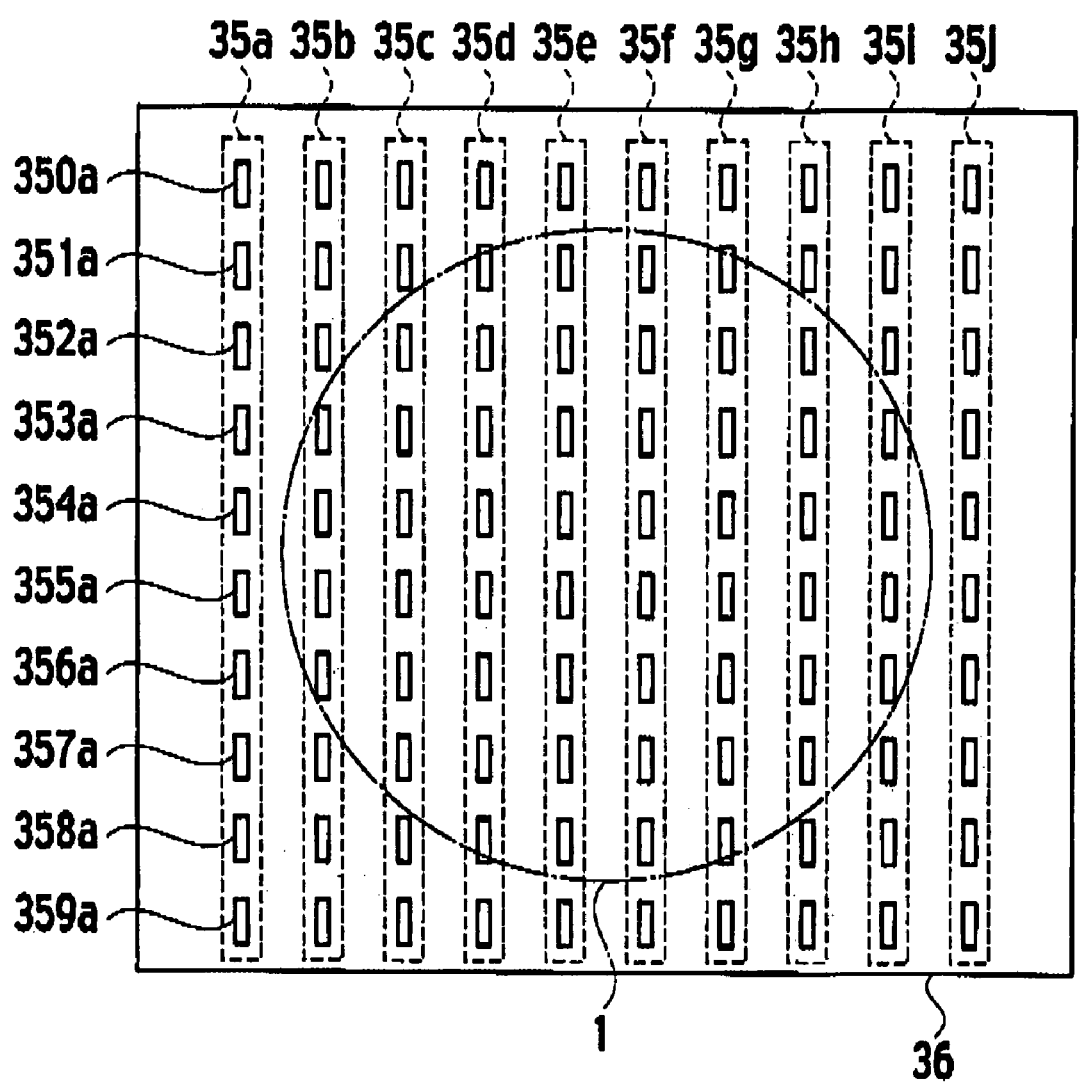
FIG. 2 is a plan view illustrating an example of a reflection plate according to the embodiment.

The reflection plate 36 is accommodated in a lamp housing 34 for accommodating the lamps 35a to 35j placed above the treatment chamber 30. As shown in FIG. 2, in the reflection plate 36, a plurality of light shielding plates 350a, 351a, 352a, 353a, 354a, 355a, 356a, 357a, 358a, and 359a is selectively placed immediately above the lamp 35a, Also allocated immediately above each of the lamps 35b to 35j is a plurality of light shielding plates, though reference numerals thereof are omitted in FIG. 2. The plurality of light shielding plates is arranged in a matrix over the entire surface of the reflection plate 36.

Figure 3:
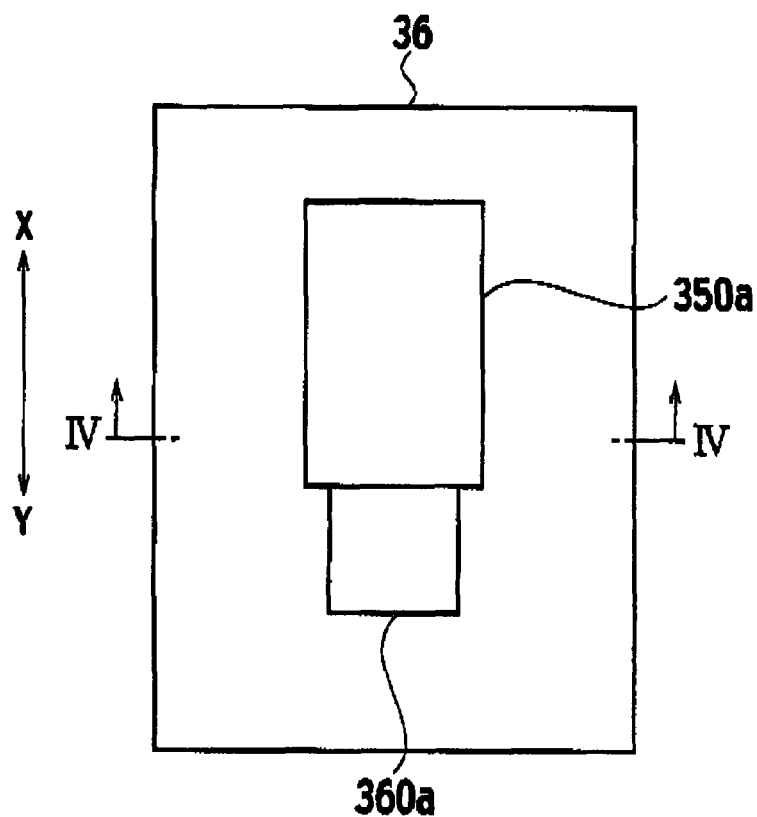
FIG. 3 is a plan view illustrating the reflection plate according to the embodiment.
Figure 4:
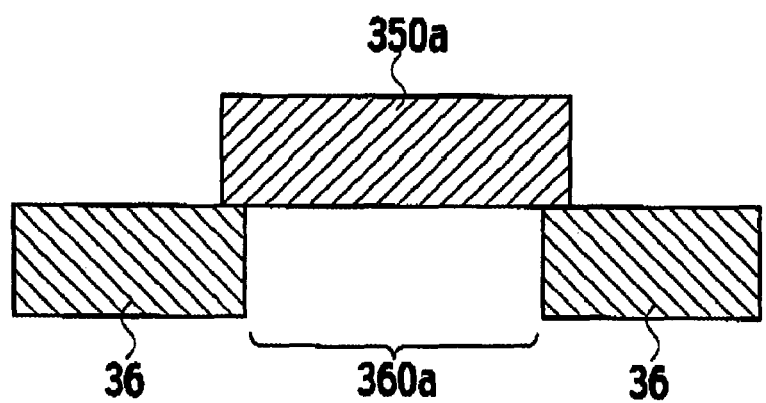
FIG. 4 is a cross-sectional view taken on line IV-IV in FIG. 3.

FIG. 3 is an enlarged top plan view of the light shielding plate 350a illustrated in FIG. 2, and FIG. 4 is a cross-sectional view taken along the line IV-IV in FIG. 3. The reflection plate 36 includes an opening portion 360a which is slightly smaller than the light shielding plate 350a. The light shielding plate 350a can be slidably moved in the longitudinal direction of the opening portion 360a, in other words, in the X-Y direction shown in FIG. 3, on the reflecting plate 36. By moving the light shielding plate 350a, a degree of opening (an opening area) of the opening portion 360a can be adjusted. Hereinafter, the embodiment describes an example where the light shielding plate 350a is manually moved, but an electric mechanism may be provided to move the light shielding plate 350a.

Figure 5:
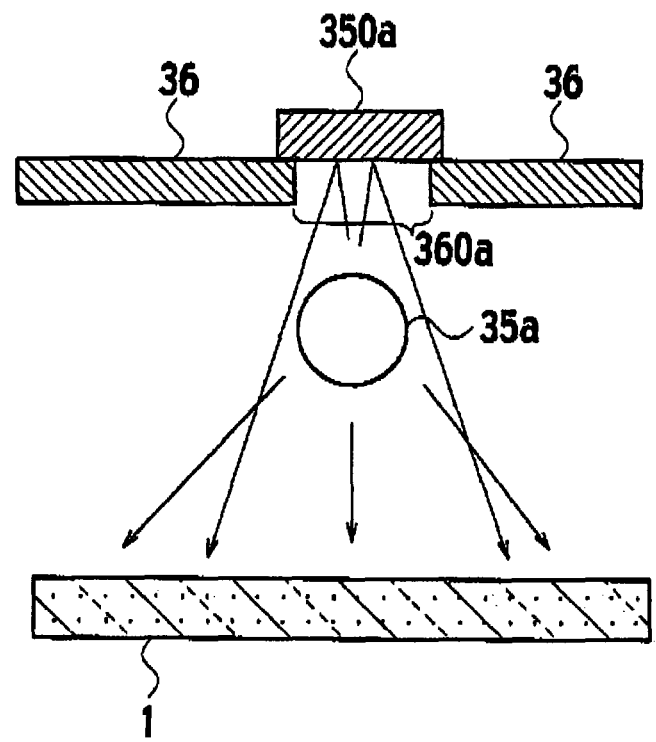
FIG. 5 is a schematic diagram illustrating a ray light emitted from a lamp according to the apparatus for manufacturing semiconductor devices according to the embodiment.
Figure 6:
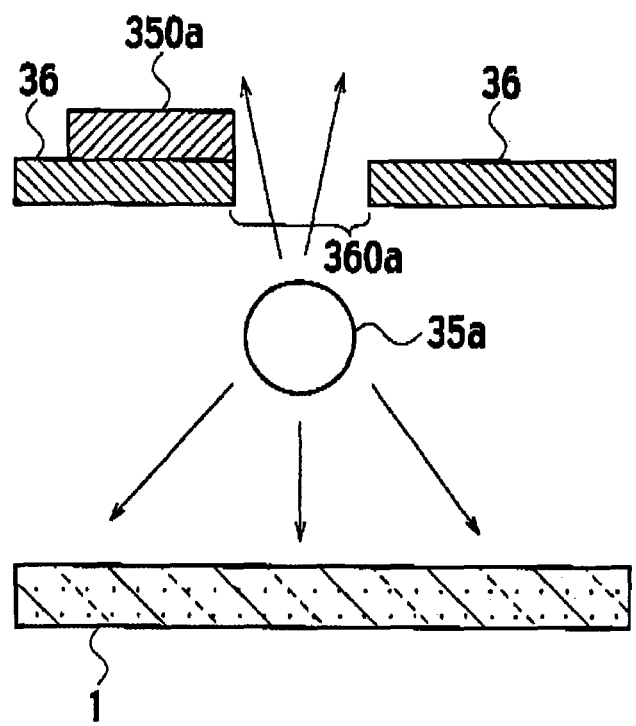
FIG. 6 is a schematic diagram illustrating a ray of light emitted from a lamp according to the apparatus for manufacturing semiconductor devices according to the embodiment.

As shown in FIG. 5, by providing the light shielding plate 350a, when, for example, the opening portion 350a is covered with the light shielding plate 350a, light emitted from the lamp 35a is reflected by the light shielding plate 350a, and then irradiates the working substrate 1 placed below the lamp 35a. Meanwhile, as shown in FIG. 6, when the opening portion 360a is not covered with the light shielding plate 350a, a part of light emitted from the lamp 35a passes through the opening portion 360a and does not irradiate the working substrate 1, thus making it possible to adjust the intensity of light which irradiates the working substrate 1.

A material of the reflection plate 36 may be an aluminum plate or a stainless steel plate (SUS) with the surfaces polished. A preferred material of the light shielding plate 350a is a material with which reflection rate of the light shielding plate 350a in a wavelength range necessary for heating the working substrate 1 becomes substantially similar to reflection rate of the reflection plate 36, for example, within an error span of reflection rate of +/−5%. Therefore, an aluminum plate or a stainless steel plate (SUS) with the surfaces polished can be used.

As shown in FIG. 1, a heat source 31 such as a hot plate is placed in the treatment chamber 30. Temperature of the heat source 31 is controlled by a control system (not shown) connected to outside the treatment chamber 30. On the top surface of the heat source 31, a susceptor 32 made from quartz or the like is placed. On the top surface of the susceptor 32, the working substrate 1 is mounted.

The working substrate 1 may be a semiconductor substrate (silicon wafer) directly cut out from ingot, a so-called epitaxial growth substrate where epitaxial growth has happened on a Silicon (Si) substrate, and a substrate having a composite construction of Si and other material, such as a silicon on insulator substrate.

Although not shown in the drawing, introduction piping for introducing ambient gas into the treatment chamber 30 and exhaust piping for exhausting ambient gas from the treatment chamber 30 are connected to the treatment chamber 30. In the upper part of the treatment chamber 30, a transparent window 33 is placed.

The lamps 35a to 35j may be stick-shaped flash lamps in which any one of xenon gas, argon gas, krypton gas, and cesium gas is filled, or stick-shaped halogen lamps with filaments filled with halogen gas. The lamps 35a to 35j are connected to a power source (now shown) such as a pulse power supply that is connected to outside the lamp housing 34. A pulse duration and radiant energy of light emitted from the lamps 35a to 35j are controlled by the power source.

Figure 7:
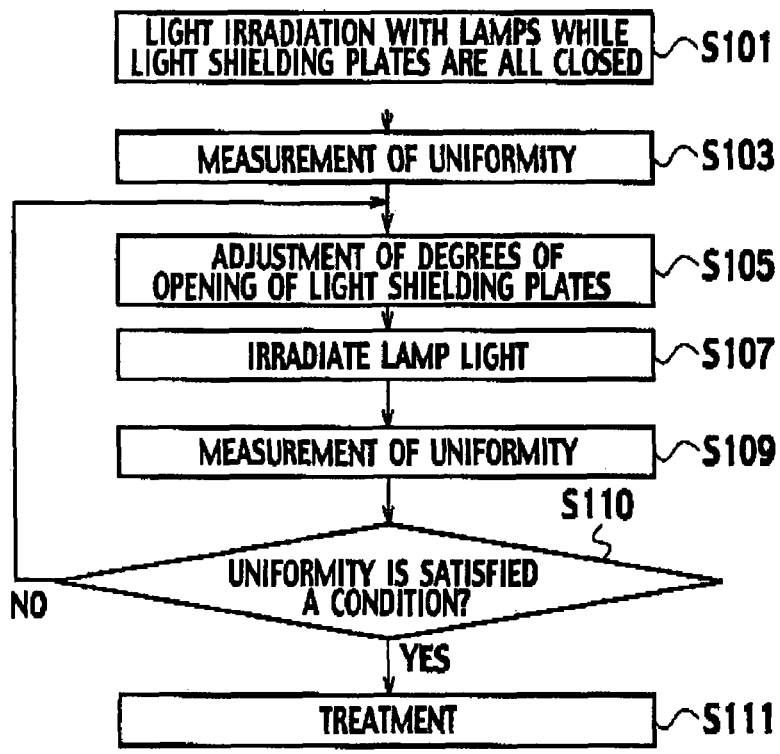
FIG. 7 is a flowchart illustrating a method of using the apparatus for manufacturing semiconductor devices according to the embodiment.

An example of how to use the semiconductor device manufacturing equipment is described with reference to the flowchart in FIG. 7.

A plurality of working substrates 1 are prepared. Prepared as the working substrates 1 are, for example, substrates obtained by the following method. After cleaning a silicon wafer by dipping into diluted hydrofluoric acid, impurity ion is implanted into source/drain forming regions of the silicon wafer using ion implantation equipment. Conditions for ion implantation are set so that a sheet resistance after annealing reaches a value which realizes sufficient sensitivity to FLA radiant energy conditions. For example, boron ion implantation is carried out at acceleration energy of 10 KeV with a dose of $5 \times 10^{15}$ cm$^{-2}$.

In step of S101, the working substrate 1 (a first working substrate) is carried into the treatment chamber 30 of the semiconductor device manufacturing equipment illustrated in FIG. 1, and is irradiated with light from the lamps 35a to 35j with temperature of the heat source 31 of 450 degrees centigrade while the opening portions of the reflection plate 36 are all closed with the light shielding plates 350a, 350b, . . . shown in FIG. 2.

Figure 8:
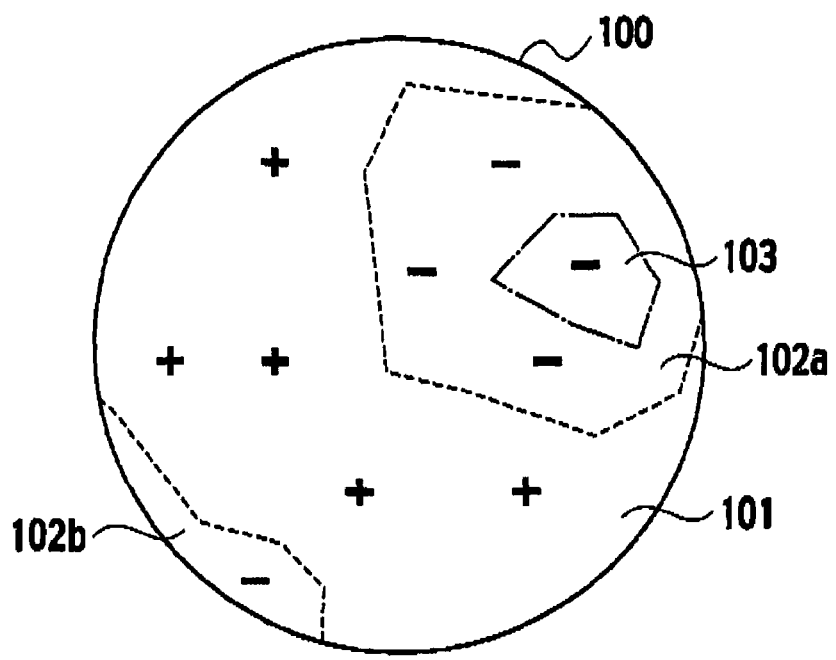
FIG. 8 is an example of a measurement result of uniformity on a wafer surface to be treated when all reflection members on the reflection plate are closed by light shielding plates and flash lamp light is emitted from lamps according to the embodiment.

In step S103, the first working substrate is carried out of the treatment chamber 30, and uniformity of sheet resistance values on the wafer surface is measured by using a sheet resistance measuring instrument. An example of a sheet resistance measurement result is shown in FIG. 8. FIG. 8 two-dimensionally shows an example of areas having higher resistance values and lower resistance values based on the result of sheet resistance values measured at a plurality of points on the surface of the first working substrate 100.

In FIG. 8, a region 101 indicated by "+" represents a region where sheet resistance values are higher than an average value. Regions 102a and 102b indicated by "−" represent regions where sheet resistance values are lower than the average value. Locations indicated by a dotted line represent places having the average sheet resistance value. A region 103 surrounded by an alternate long and short dashed line represents a region having sheet resistance values which deviate from the average value by three sigma. In this embodiment, "uniformity" is defined as, for example, a value produced by dividing a standard deviation of sheet resistance values within a wafer surface by an average sheet resistance value of the wafer surface, and then multiplying the resultant value by 100. The uniformity of the working substrate 100 shown in FIG. 8 is approximately 5%. The region with higher sheet resistance values represents a region at lower temperature, and the region with lower sheet resistance values represents a region at higher temperature.

Figure 9:
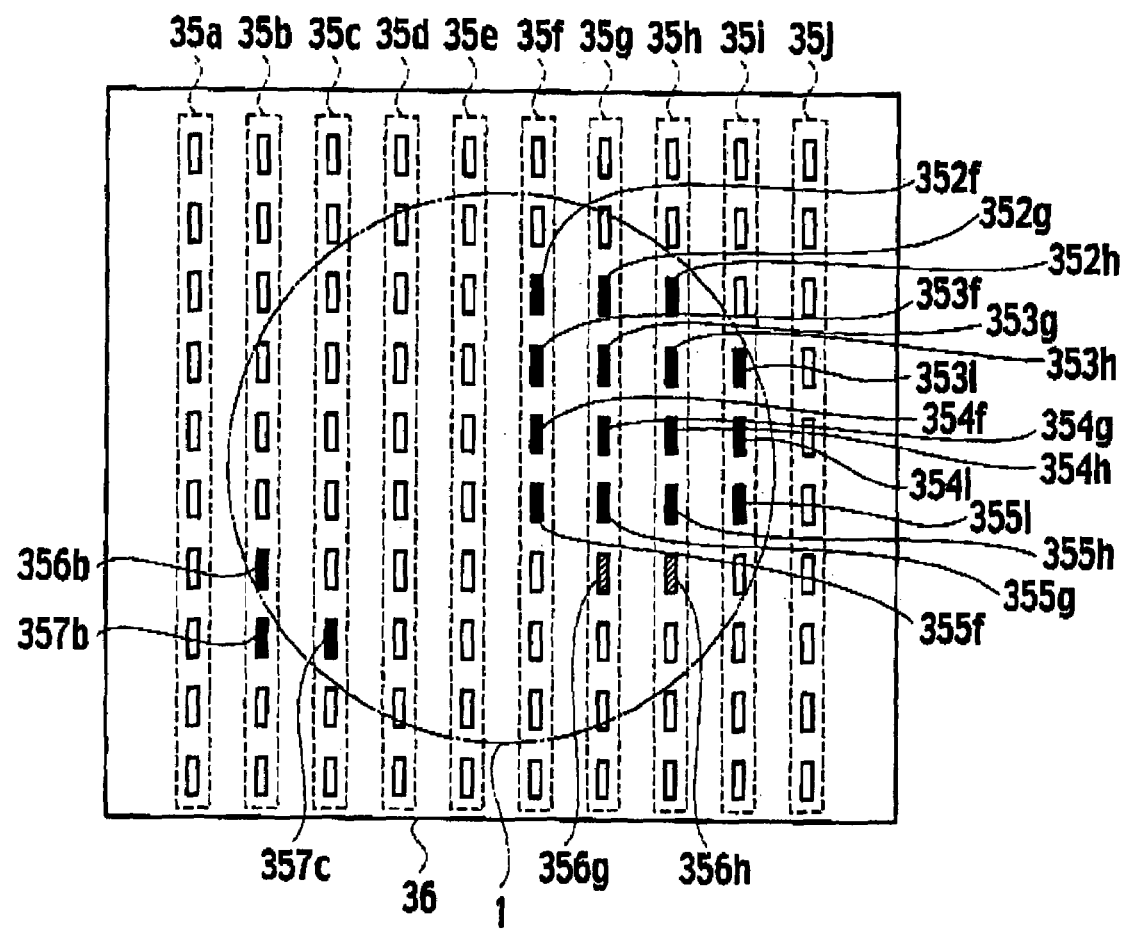
FIG. 9 is a plan view illustrating the reflection plate according to the embodiment.

In step S105, while referring to the result shown in FIG. 8, the light shielding plates provided above the opening portions of the reflection plate 36 are moved in areas corresponding to the regions where sheet resistance values are lower than the average so that degrees of opening of the opening portions are increased. In FIG. 8, since the sheet resistance values of the regions 102a and 102b are lower than the average, the light shielding plates 352f, 353f, 354f, 355f, 352g, 353g, 354g, 355g, 352h, 353h, 354h, 355h, 356b, 357b, and 357c shown in FIG. 9 are moved, and the entire opening portions below the light shielding plates 352f to 357c are exposed. Also, the light shielding plates 356g and 356h in the vicinity of the region 102a are moved so that the opening portions below the light shielding plates 356g and 356h are open about half of the entire opening areas. The rest of opening portions are left closed with the light shielding plates.

In step S107, a second working substrate which has the same characteristics as the first working substrate 100 is carried into the treatment chamber 30, and irradiated by light under the same radiant energy conditions as the first working substrate 100. In step S109, the second working substrate is carried out of the treatment chamber 30, and uniformity of sheet resistance values on the wafer surface is measured by using the sheet resistance measuring instrument.

In step S110, it is determined whether the uniformity of sheet resistance values of the wafer surface satisfies a predetermined condition. If the condition is not satisfied, the process proceeds to steps S105, and degrees of opening of the opening portions of the reflection plate 36 are adjusted once again by using the light shielding plates based on the measurement result of the second working substrate. If the condition is met, the process proceeds to step S111, and another working substrate having the same characteristics as the first and second working substrates is treated.

Figure 10:
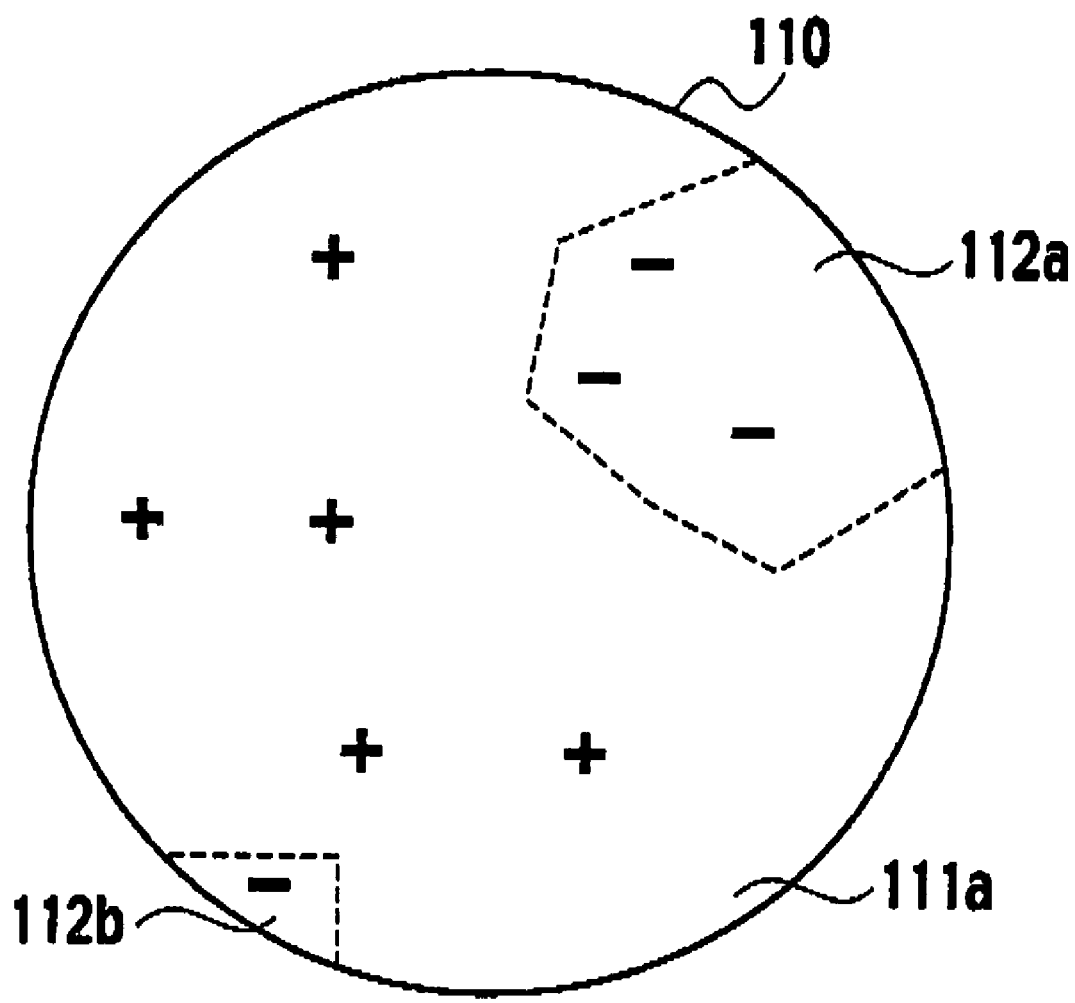
FIG. 10 is an example of a measurement result of uniformity on a wafer surface according to the embodiment.

FIG. 10 illustrates an example of uniformity measurement results for the wafer surface of the working substrate 110 obtained by the treatment in step S111. As compared to FIG. 8, it is evident that, in the example depicted in FIG. 10, a region with an extremely lower sheet resistance values than the average is no longer present. Further, the areas of regions 112a and 112b with sheet resistance values that are lower than the average are now smaller than the regions 102a and 102b in FIG. 8, and the area of a region 111a with higher sheet resistance values than the average is now larger than the region 101 shown in FIG. 8. Uniformity of sheet resistance values of the working substrate 110 shown in FIG. 10 is 1%. By using the semiconductor device manufacturing equipment shown in FIG. 1, uniformity of sheet resistance values of a working substrate can be improved.

A working substrate is heated by comprehensive effects of light incoming from the lamps 35a to 35j directly onto the working substrate, incoming light reflected by the reflection plate 36 onto the substrate, incoming light reflected by the inner wall of the treatment chamber 30 onto the substrate. In the semiconductor device manufacturing equipment shown in FIG. 1, since the reflection plate 36 is provided with the plurality of opening portions and the light shielding plates 350a, 350b, . . . which can adjust degrees of opening of the opening portions, by adjusting degrees of opening of the opening portions in the reflection plate 36 by moving the light shielding plates 350a, 350b, . . . , the intensity of light emitted from the lamps onto a working substrate can be adjusted. For example, by increasing the degrees of opening of the opening portions, light from the lamps 35a to 35j passes through the backside of the reflection plate 36, reducing an intensity of light reflected by the reflection plate 36 and incoming onto the working substrate 1. In other words, reflection intensity of light at the reflection plate 36 can be adjusted two-dimensionally. Hence, intensities of light emitted onto the working substrate can be equalized, and temperature of heat treatment can be equalized. As a result, productivity of semiconductor devices can be improved.

—Method for Manufacturing Semiconductor Device—

A method for manufacturing a semiconductor device according to the embodiment of the present invention is described with reference to FIGS. 11 to 20, by describing a manufacturing process of a complementary metal-oxide semiconductor (CMOS) transistor, one of basic components of a semiconductor device, as an example. Note that a basic component of a semiconductor device is not limited to a CMOS transistor and may be a PMOS transistor, an nMOS transistor, or the like. Also, it is obvious that a basic configuration is not limited to an oxide film transistor but may be a metal insulator semiconductor (MIS) transistor which also includes a nitrogen film and an oxynitride film.

Figure 11:
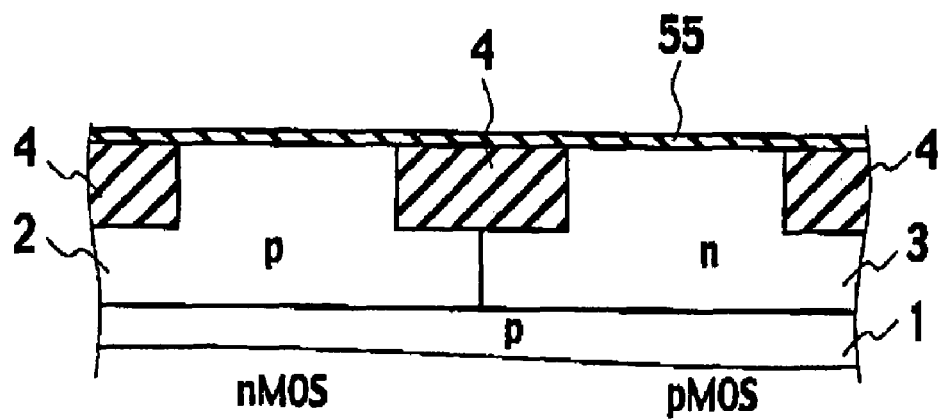
FIG. 11 is a cross-sectional view illustrating a method for manufacturing semiconductor devices according to the embodiment.

After forming device isolation regions 4 by burying a silicon oxide film for device isolation into a semiconductor substrate 1, impurity ion is implanted. Activation annealing is conducted in a nitrogen gas atmosphere at 1050 degrees centigrade for about 10 seconds by using a lamp annealing equipment. For example, a p-well 2 is formed within an nMOS region and an n-well 3 is formed within a pMOS region of a p-type Si semiconductor substrate 1 or the like. Thereafter, as shown in FIG. 11, an insulator 55 such as a thermal oxide film is formed on the surface of the semiconductor substrate 1.

Figure 12:
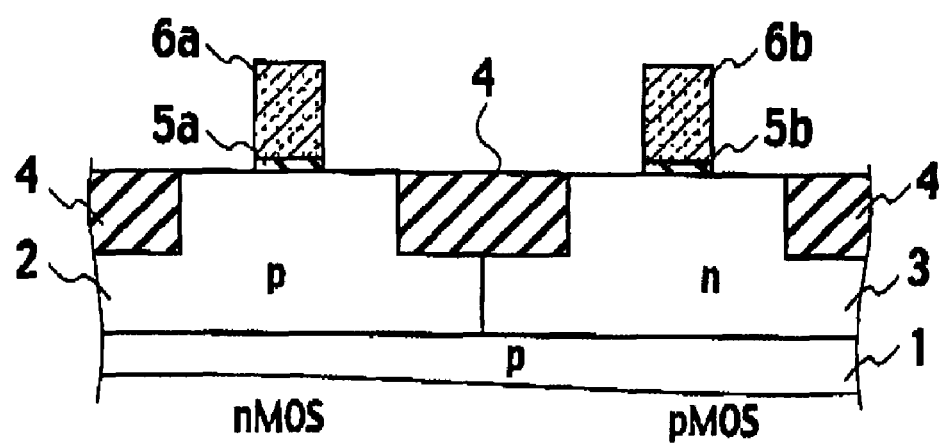
FIG. 12 is a cross-sectional view illustrating a method for manufacturing semiconductor devices according to the embodiment.
Figure 13:
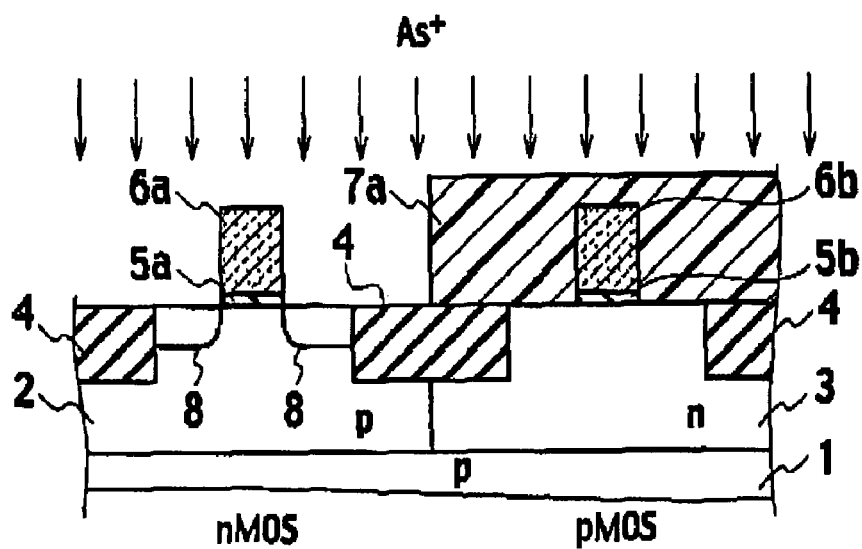
FIG. 13 is a cross-sectional view illustrating a method for manufacturing semiconductor devices according to the embodiment.

On the insulator 55, a polysilicon film is deposited with a thickness of about 100 nm to 200 nm by a chemical vapor deposition (CVD) method, a low-pressure chemical vapor deposition (LPCVD) method, or the like, for example. The polysilicon film and the insulator 55 are selectively removed by photolithography and reactive ion etching (RIE), and, as shown in FIG. 12, gate insulators 5a and 5b and gate electrodes 6a and 6b are formed on the nMOS region and pMOS region on the surface of the semiconductor substrate 1, respectively.

A resist film 7a is formed on the pMOS region of the semiconductor substrate 1 by photolithography. By using the resist film 7a and the gate electrode 6a of the nMOS region as masks, a V-family element which serves as an n-type impurity, for example, arsenic (As$^+$) is implanted selectively at a concentration ranging from about $1 \times 10^{14}$ cm$^{-2}$ to $2 \times 10^{15}$ cm$^{-2}$ by an ion implantation, and impurity implanted layers 8 are formed between both ends of the gate insulator 5a and the device isolation regions 4. Thereafter, the resist film 7a is removed.

Figure 14:
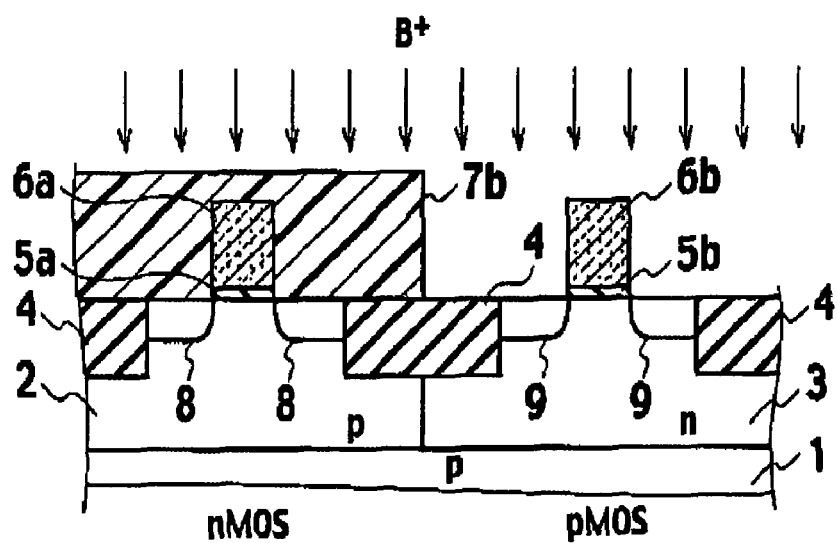
FIG. 14 is a cross-sectional view illustrating a method for manufacturing semiconductor devices according to the embodiment.

As shown in FIG. 14, a resist film 7b is formed on the nMOS region of the semiconductor substrate 1 by photolithography. A III-family element which serves as a p-type impurity, such as boron (B$^+$), is implanted selectively at a concentration ranging from about $1 \times 10^{14}$ cm$^{-2}$ to $2 \times 10^{15}$ cm$^{-2}$ while using the resist film 7b and the gate electrode 6b of the pMOS region as masks, so that an impurity implanted layers 9 are formed between both ends of the gate insulator 5b and the device isolation regions 4. Thereafter, the resist film 7b is removed.

Figure 15:
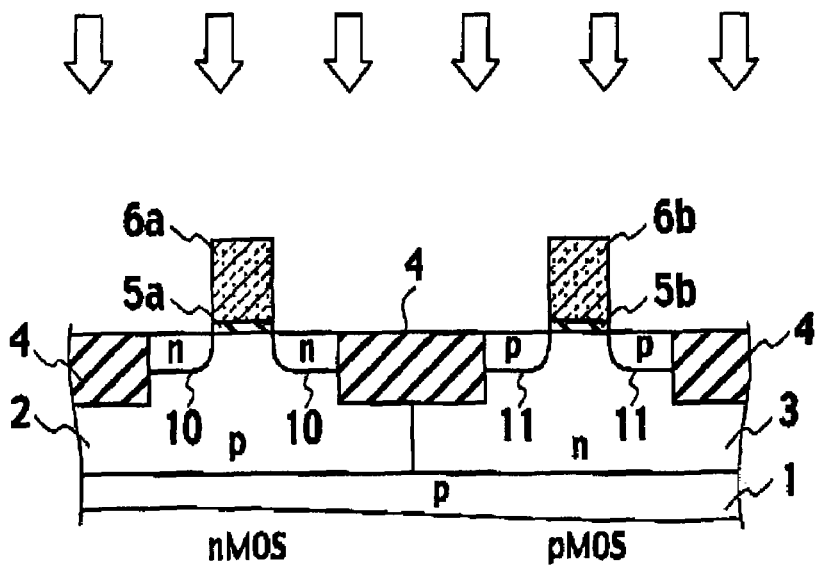
FIG. 15 is a cross-sectional view illustrating a method for manufacturing semiconductor devices according to the embodiment.

Next, by performing annealing at about 700 to 800 degrees centigrade by using lamp annealing equipment, heat treatment for restoring a crystal defect is carried out. In the heat treatment, although As$^+$ and B$^+$ that have been implanted into the impurity implanted layers 8 and 9 are still not activated sufficiently, a crystal defect generated during ion implantation is restored and re-crystallization occurs, and, as shown in FIG. 15, n-type extension regions 10 and p-type extension regions 11 are formed between both ends of the respective gate insulators 5a and 5b and the device isolation regions 4.

Figure 16:
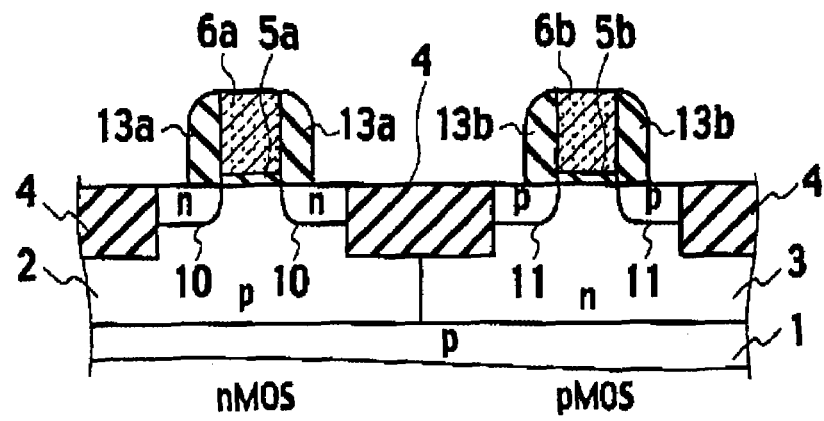
FIG. 16 is a cross-sectional view illustrating a method for manufacturing semiconductor devices according to the embodiment.

On the semiconductor substrate 1, insulators including a silicon oxide ($SiO_2$) film and a silicon nitride ($Si_3N_4$) film are deposited sequentially by CVD, LPCVD or the like. As shown in FIG. 16, sidewall spacers 13a and 13b having a multi-layer structure of the $Si_3N_4$ film and the $SiO_2$ film are formed on the side surfaces of the gate electrodes 6a and 6b and gate insulators 5a and 5b, respectively, by using a dry etching. Note that, a thickness of the $Si_3N_4$ film may be between about 10 nm and 30 nm, and a thickness of the $SiO_2$ film may be between 5 nm and 20 nm.

Figure 17:
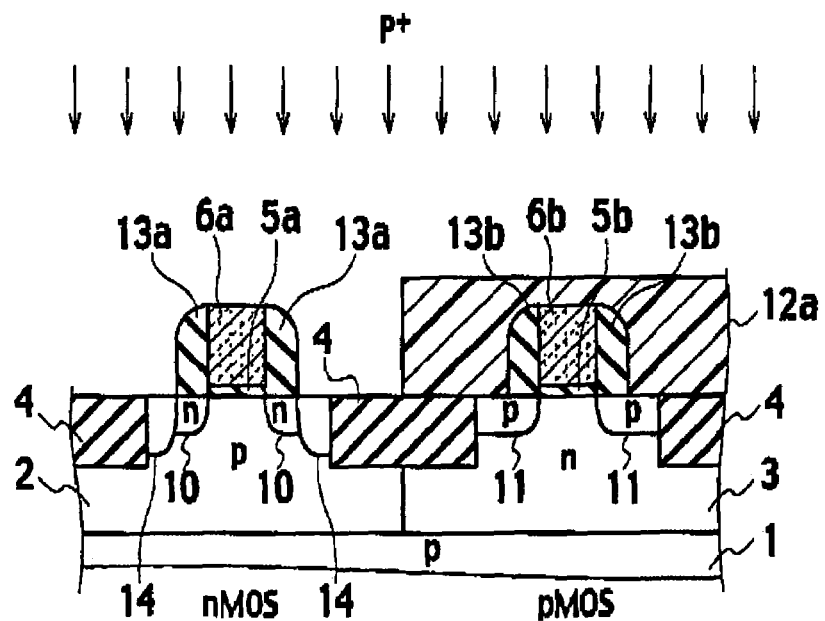
FIG. 17 is a cross-sectional view illustrating a method for manufacturing semiconductor devices according to the embodiment.

A resist film 12a is formed on the pMOS region by photolithography. A V-family element which serves as an n-type source/drain impurity, such as P-ion, is implanted into the nMOS region at a concentration of about $5\times10^{14}$ $cm^{-2}$ to $5\times10^{15}$ $cm^{-2}$ while using the gate electrodes 6a and the sidewall spacers 13a as masks. As a result, as shown in FIG. 17, impurity implanted layers 14 in which P-ion is implanted more deeply than the extension regions 10 are formed within the nMOS region of the semiconductor substrate 1 and between both ends of the sidewall spacers 13a and the device isolation regions 4. Thereafter, the resist film 12a is removed.

Figure 18:
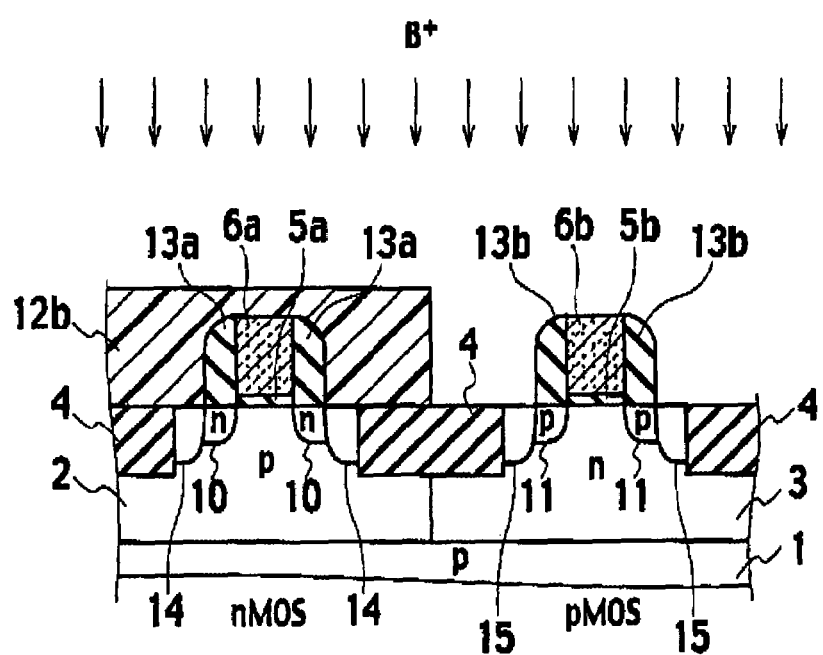
FIG. 18 is a cross-sectional view illustrating a method for manufacturing semiconductor devices according to the embodiment.

A resist film 12b is formed in the nMOS region by photolithography. A III-family element which serves as a p-type source/drain impurity, such as B-ion is implanted selectively at a concentration of about $5\times10^{14}$ $cm^{-2}$ to $5\times10^{15}$ $cm^{-2}$ while using the gate electrodes 6b and the sidewall spacers 13b as masks. As a result, as shown in FIG. 18, impurity implanted layers 15 in which B-ion is implanted more deeply than the extension regions 11 are formed within the pMOS region and between both ends of the sidewall spacers 13b and the device isolation regions 4. Thereafter, the resist film 12b is removed.

Next, to perform flash lamp treatment, substrates for adjustment which are used for uniformity adjustment are prepared. Prepared as unprocessed silicon single-crystal substrates without any pattern are a plurality of wafers where ion has been implanted similarly to ion implantation performed for the extension regions or source/drain regions in the pMOs or nMOS region of the semiconductor substrate 1 shown in FIG. 18, Among the semiconductor substrates prepared, the first semiconductor substrate is mounted on the susceptor 32 in the treatment chamber 30 shown in FIG. 1. For thermal treatment for activation, the first semiconductor substrate is preheated by the heat source 31 of the susceptor 32 to about 400 to 600 degrees centigrade from the back side.

With all the opening portions provided in the reflection plate 36 in FIG. 1 being closed by the light shielding plates 350a, 350b, . . . , shown in FIG. 2, the first semiconductor substrate is irradiated by flash lamp light from the lamps 35a to 35j under conditions of, for example, a pulse duration of 1 ms and radiant energy of 20 to 30 $J/cm^2$ while maintaining the first semiconductor substrate at the pre-heated temperature of 450 degrees centigrade.

The first semiconductor substrate is carried out from the treatment chamber 30, and uniformity of sheet resistance values of the wafer surface is measured by using a sheet resistance measuring instrument. While referring to the measurement result from the sheet resistance measuring instrument, the light shielding plate above the opening portions of the reflection plate 36 are moved in an area which corresponds to a region where sheet resistance values are lower than the average, so that degrees of opening of the opening portions are adjusted. Next, the second semiconductor substrate is carried into the treatment chamber 30, and is irradiated by flash lamp light from the lamps 35a to 35j under the same radiant energy conditions as those for the first semiconductor substrate. The second semiconductor substrate is then carried out of the treatment chamber 30, and uniformity of sheet resistance values of the wafer surface is measured by using the sheet resistance measuring instrument. Thereafter, it is determined whether the uniformity of sheet resistance values of the wafer surface of the second semiconductor substrate satisfies a predetermined condition. If the condition is not satisfied, the degrees of opening of the opening portions of the reflection plate 36 are adjusted once again by using the light shielding plates. If the condition is satisfied, the semiconductor substrate 1 shown in FIG. 18 after the resist film 12b is removed is mounted on the susceptor 32.

Figure 19:
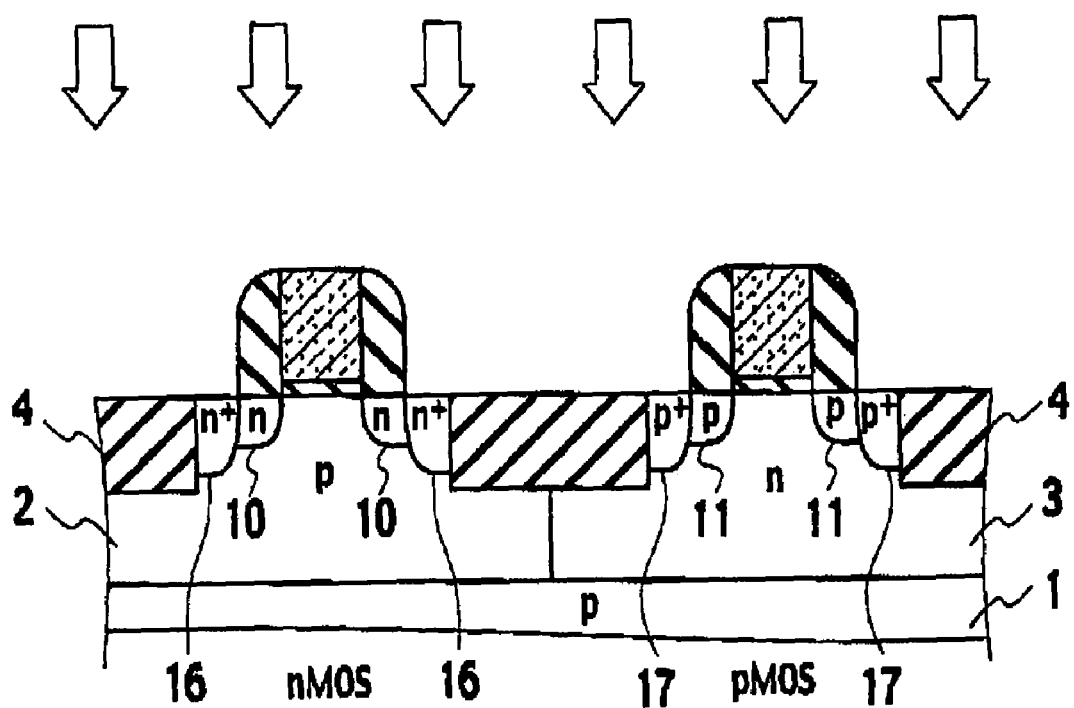
FIG. 19 is a cross-sectional view illustrating a method for manufacturing semiconductor devices according to the embodiment.

The semiconductor substrate 1 mounted on the susceptor 32 is irradiated by flash lamp light from the lamps 35a to 35j under the same radiant energy conditions as those used for the first and second semiconductor substrates, and, as shown in FIG. 19, n-type source/drain regions 16 are formed in contact with the extension regions 10 and between the ends of the sidewall spacers 13a and device isolation regions 4. Further, p-type source/drain regions 17 are formed in contact with the extension regions 11 and between the ends of the sidewall spacers 13b and the device isolation regions 4. After the impurity implanted layers 14 and 15 are formed, annealing may be performed by using lamp annealing equipment at about 600 to 200 degrees centigrade for the purpose of recovery of a crystal defect before performing FLA by the semiconductor device manufacturing equipment illustrated in FIG. 1.

Figure 20:
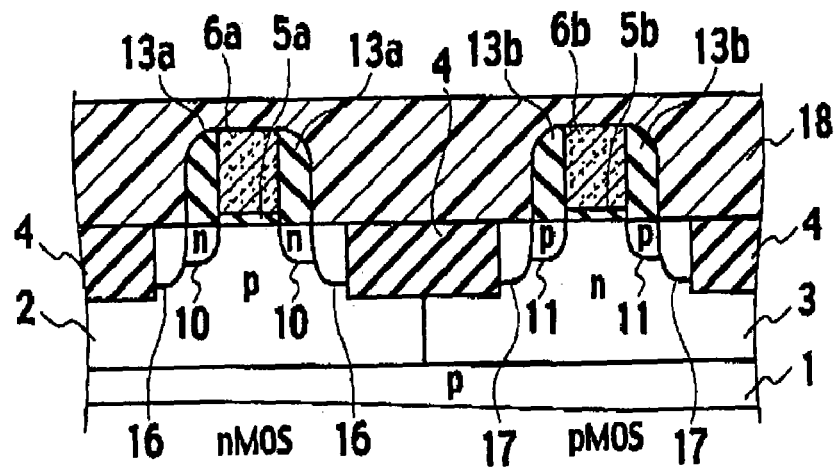
FIG. 20 is a cross-sectional view illustrating a method for manufacturing semiconductor devices according to the embodiment.
Figure 21:
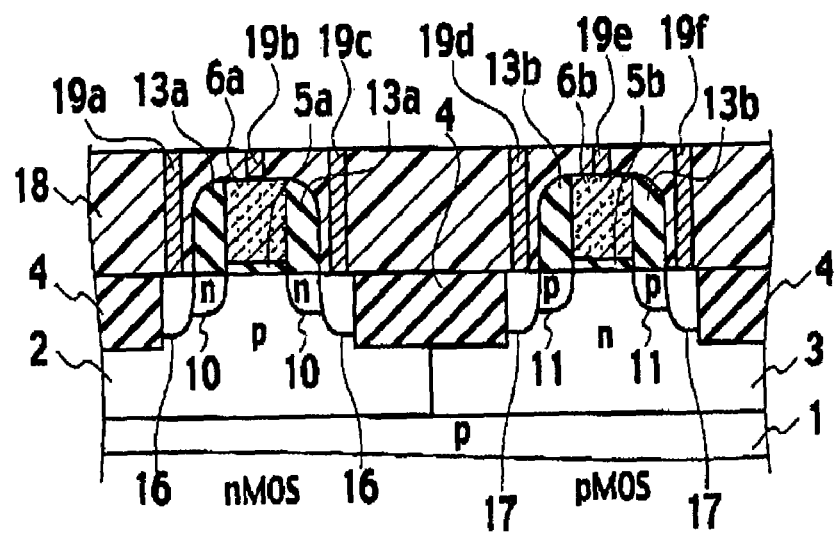
FIG. 21 is a cross-sectional view illustrating a method for manufacturing semiconductor devices according to the embodiment.

As shown in FIG. 20, an interlayer insulator 18 such as a $SiO_2$ film is deposited on the entire surface of the semiconductor substrate 1. As shown in FIG. 21, in a contact formation process, contact electrodes leading to the gate electrodes 6a and 6b and the source/drain regions 16 and 17 are drawn out, thus completing a semiconductor device.

According to the semiconductor device of the present embodiment, since intensities of light emitted onto the semiconductor substrate 1 are equalized, heat treatment temperature can be equalized, thus improving productivity.

(Modification)

Figure 22:
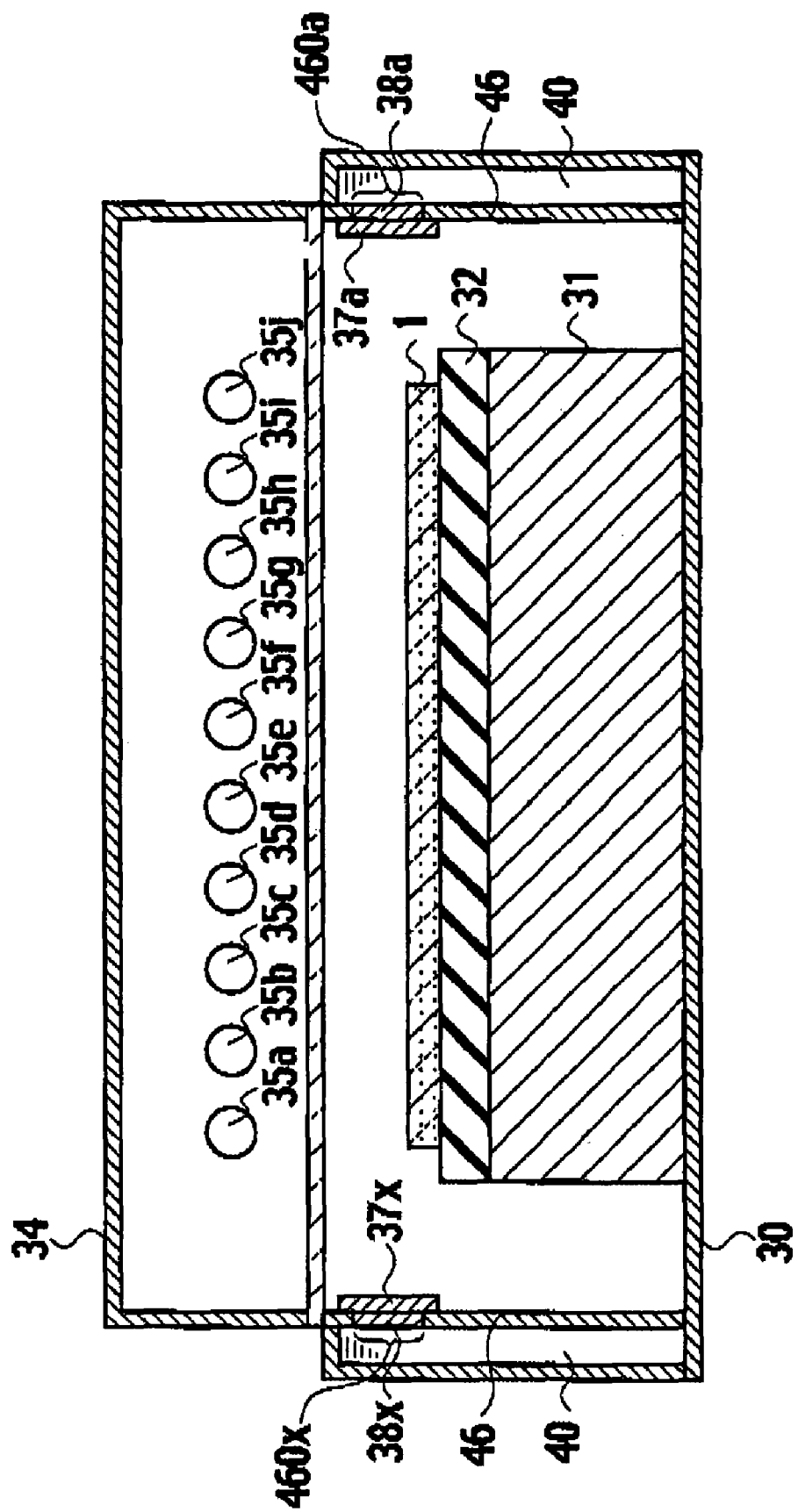
FIG. 22 is a cross-sectional view illustrating a method for manufacturing semiconductor devices according to a modification of the embodiment.

As shown in FIG. 22, a semiconductor device manufacturing equipment according to a modification of the embodiment is different from the semiconductor device manufacturing equipment in FIG. 1, in that the semiconductor device manufacturing equipment according to a modification of the embodiment includes a reflecting device which spatially controls a in-plane distribution of reflection power of light from the lamps 35a to 35j and irradiating a working substrate 1 with light from the lamps 35a to 35j. The reflecting device includes a reflecting member 46 placed on an inner wall of a treatment chamber 20, a plurality of opening portions 460a and 460x, reflection suppressing members 38a and 38x buried in the opening portions 460a and 460x, respectively, and a plurality of movable light shielding plates 37a and 37x which cover the reflection suppressing members 38a and 38x, respectively.

Figure 23:
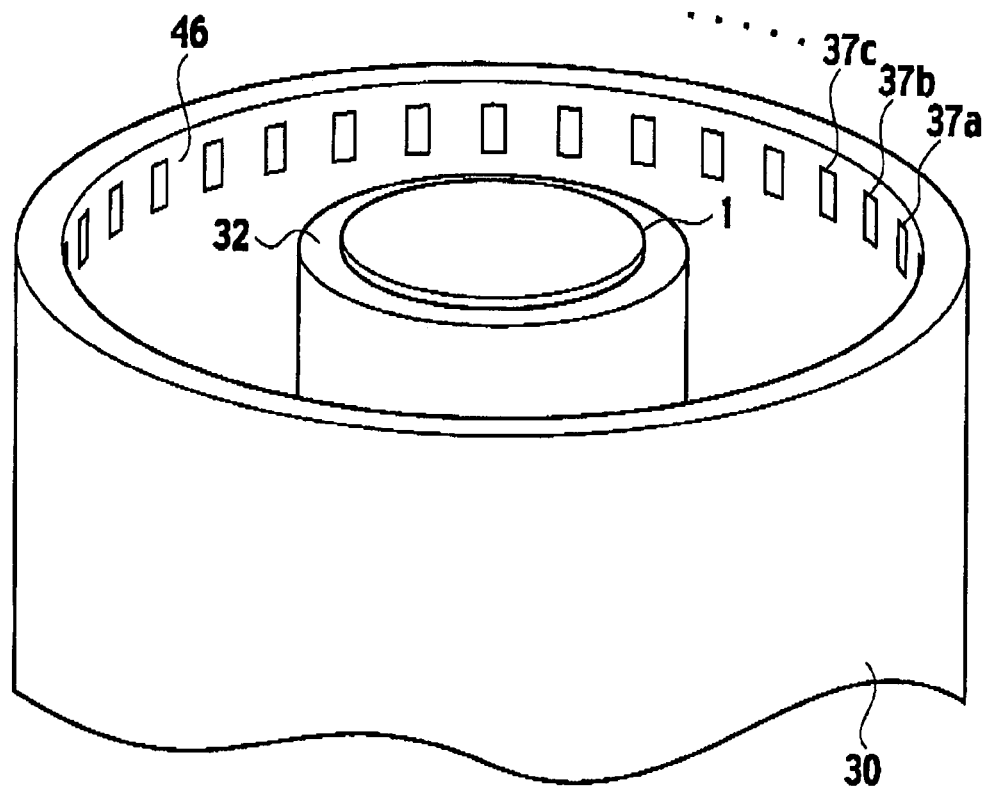
FIG. 23 is a cross-sectional view illustrating a method for manufacturing semiconductor devices according to a modification of the embodiment.

As shown in FIG. 23, the reflecting member 46 is provided over the entire inner wall surface of the treatment chamber 30. The light shielding plates 37a, 37b, 37c, . . . , are arranged separately along the inner circumference of the inner wall of the treatment chamber 30, surrounding the outer circumference of a susceptor 32 where the working substrate 1 is mounted. As shown in FIG. 22, the opening portions 460a and 460x are formed slightly smaller than the light shielding plates 37a and 37x. Cooling water 40 is pored on the outer side of the inner wall on which the reflecting member 46 is formed, making it possible to water-cool the inner wall of the treatment chamber 30. The rest of parts are the same as those of the semiconductor device manufacturing equipment shown in FIG. 1, and thus descriptions thereof are omitted.

FIGS. 24 and 25 describe a state where flash lamp light emitted from the lamps 35i and 35k is reflected. Here, illustration of the transparent window 33 shown in FIG. 22 is omitted. As shown in FIG. 24, when the reflection suppressing member 38a is covered by the light shielding plate 37a, light from the lamps 35i and 35j is reflected and fail onto the working substrate 1. On the other hand, as shown in FIG. 25, when the reflection suppressing member 38a is exposed by slightly moving the light shielding plate 37a, light emitted from the lamps 35i and 35j is absorbed by the reflecting suppressing member 38a, thus reducing the intensity of light falling onto the working substrate 1. Therefore, by arranging the reflection suppressing member 38a and the light shielding plate 37a in the inner wall of the treatment chamber 30, it becomes possible to adjust light intensities so that intensities of light on the outer circumference portion of the working substrate can be equalized.

Figure 26:
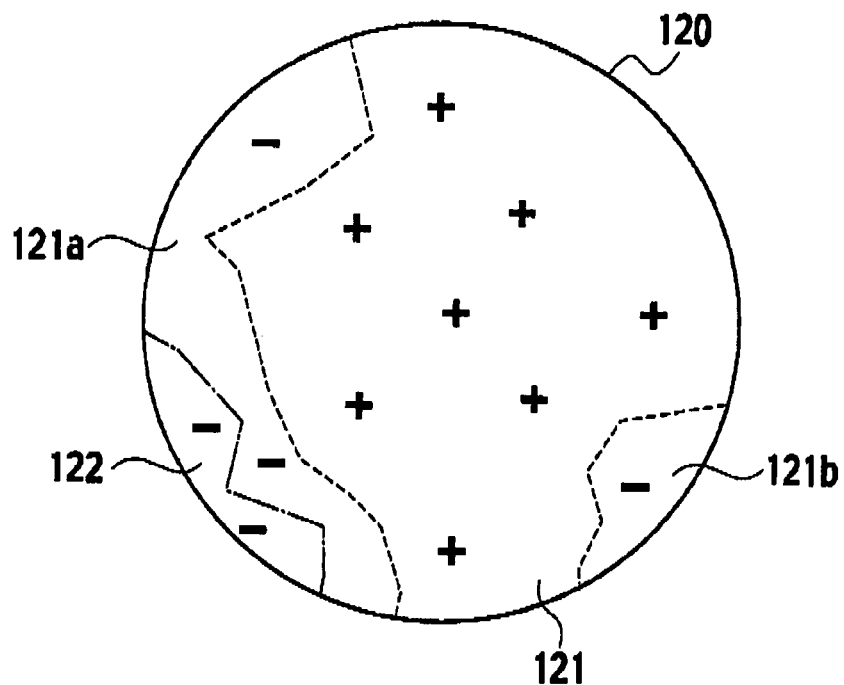
FIG. 26 is an example of a measurement result of uniformity on a wafer surface to be treated when all reflection members on the reflection plate are closed by light shielding plates and flash lamp light is emitted from lamps according to the embodiment.

FIG. 26 shows a measurement result of uniformity on the wafer surface of a working substrate 120 when the reflection suppressing members 38a and 38x of the semiconductor device manufacturing equipment shown in FIG. 22 are all closed by the light shielding plates 37a and 37x and flash lamp light is emitted from the lamps 35a to 35j. In the example shown in FIG. 26, uniformity of sheet resistance values is 7%. Also, in the working substrate 120 shown in FIG. 26, a region where sheet resistance values are higher than an average value is in the center portion of the wafer, regions 121a and 121b where sheet resistance values are lower than the average, and a region 122 where the sheet resistance values are even lower than those of the regions 121a and 121b are located in periphery portions of the wafer.

Figure 27:
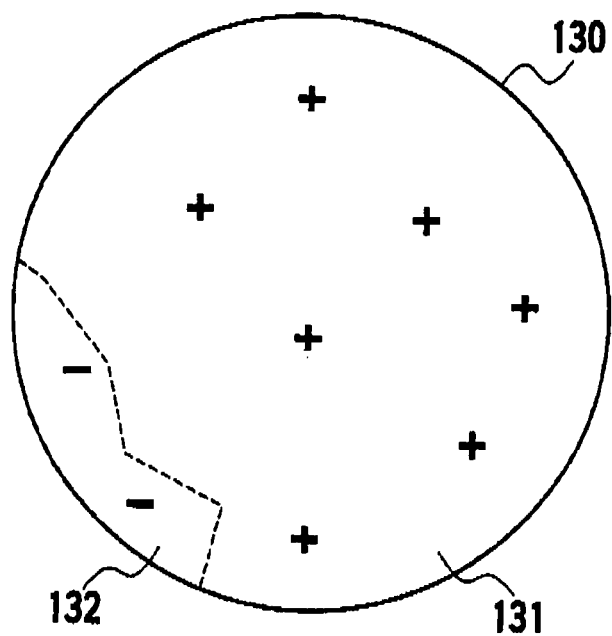
FIG. 27 is an example of a measurement result of uniformity on a wafer surface according to the embodiment.

On the other hand, FIG. 27 shows a measurement result of uniformity of the wafer surface of a working substrate 130 which has been treated after reflection of flash lamp light from the lamps 35a to 35j is adjusted by moving the light shielding plates 37a and 37x of the semiconductor device manufacturing equipment shown in FIG. 22. The area of a region 131 where a calculation result of uniformity is higher than the average is larger than that in the working substrate 120 shown in FIG. 26, and the area of a region 132 where a calculation result of uniformity is lower than the average is smaller than that in the working substrate 120 shown in FIG. 26. The uniformity of the wafer surface in FIG. 27 is 2%. By using the semiconductor device manufacturing equipment shown in FIG. 22, uniformity of resistance values of the working substrate can be improved.

Various modifications will become possible for those skilled in the art after receiving the teachings of the present disclosure without departing from the scope thereof. For example, the reflecting member 46 as shown in FIG. 22 can be provided with the inner wall of the semiconductor device manufacturing apparatus as shown in FIG. 21. The reflection plate 36 as shown in FIG. 21 can be also provided with the inner wall of the semiconductor device manufacturing apparatus as shown in FIG. 22.

What is claimed is:

1. An apparatus for manufacturing a semiconductor device comprising:
    a treatment chamber in which a working substrate is disposed;
    a plurality of lamps provided above the treatment chamber; and
    a reflector provided behind the lamps relative to a direction towards the working substrate, spatially controlling an in-plane distribution of reflection rate of light beams from the lamps, and irradiating the working substrate with light from the lamps,
    wherein the reflector includes:
        a reflection plate having a plurality of opening portions; and
        a plurality of movable light shielding plates configured to cover the opening portions.

2. The apparatus of claim 1, wherein the opening portions are allocated in a matrix over an entire surface of the reflection plate.

3. The apparatus of claim 1, wherein the opening portions are allocated immediately above the lamps.

4. The apparatus of claim 1, wherein each of the lamps is one of a flash lamp in which any one of xenon gas, argon gas, krypton gas, and cesium gas is filled, and a halogen lamp with a filament filled with halogen gas.

5. The apparatus of claim 1, wherein a reflection rate of the light shielding plates in a wavelength range necessary for heating the working substrate is substantially the same as a reflection rate of the reflection plate within an error span of plus or minus 5%.

6. The apparatus of claim 1 further comprising a reflecting member disposed on an inner wall of the treatment chamber.

7. An apparatus for manufacturing a semiconductor device comprising:
    a treatment chamber in which a working substrate is disposed;
    a plurality of lamps provided above the treatment chamber; and
    a reflector provided in the treatment chamber, spatially controlling an in-plane distribution of reflection rate of light beams from the lamps, and irradiating the working substrate with light from the lamps,
    wherein the reflector comprises:
        a reflecting member disposed on an inner wall of the treatment chamber and having a plurality of opening portions;
        a plurality of reflection suppressing members buried in the opening portions; and
        a plurality of movable light shielding plates configured to cover the reflection suppressing members.

8. The apparatus of claim 7, wherein the opening portions are allocated separately along the inner wall of the treatment chamber so as to surround an outer periphery of the working substrate.

9. The apparatus of claim 7, wherein a reflection rate of the reflection suppressing members in a wavelength range necessary for heating the working substrate is lower than a reflection rate of the reflection member.

10. The apparatus of claim 7, wherein each of the lamps is one of a flash lamp in which any one of xenon gas, argon gas, krypton gas, and cesium gas is filled, and a halogen lamp with a filament filled with halogen gas.

11. A method for manufacturing a semiconductor device comprising:
    implanting impurity ions into a first semiconductor substrate and a second semiconductor substrate, respectively, to prepare a first working substrate and a second working substrate;
    carrying the first working substrate into a treatment chamber to irradiate the first working substrate with light from a plurality of lamps so as to activate the implanted ions in the first working substrate and to form a first impurity diffusion layer in the first working substrate in a condition where a plurality of opening portions of a reflection plate provided above or on an inner surface of the treatment chamber are covered with a plurality of light shielding plates;

carrying the first working substrate out of the treatment chamber;

measuring an electric characteristic of the first impurity diffusion layer;

adjusting an opening rate of the opening portions by moving the light shielding plates depending on a measurement result of the electric characteristic; and carrying the second working substrate into the treatment chamber to irradiate the second working substrate with light from the lamps so as to activate the implanted ions in the second working substrate and to form a second impurity diffusion layer in the second working substrate.

12. The method of claim 11, further comprising:
re-adjusting an opening rate of the opening portions when the measurement results of the electric characteristic does not meet a condition.

13. The method of claim 11, wherein the irradiating process uses one of flash lamps in which any one of xenon gas, argon gas, krypton gas, and cesium gas are filled, and halogen lamps with filaments filled with halogen gas.

14. The method of claim 11, the electric characteristic includes a uniformity of sheet resistance of the first impurity diffusion layer.

15. The method of claim 11, wherein the adjusting process includes moving the light shielding plates allocated in a matrix over an entire surface of the reflection plate.

16. The method of claim 11, wherein the adjusting process includes moving the light shielding plates so that a reflection suppressing members buried in the opening portions are exposed from the opening portions.

* * * * *